United States Patent
Ueda et al.

(10) Patent No.: US 9,148,107 B2
(45) Date of Patent: Sep. 29, 2015

(54) METHOD FOR MANUFACTURING ACOUSTIC WAVE DEVICE

(75) Inventors: Masanori Ueda, Tokyo (JP); Masafumi Iwaki, Tokyo (JP); Tokihiro Nishihara, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 809 days.

(21) Appl. No.: 13/362,743

(22) Filed: Jan. 31, 2012

(65) Prior Publication Data
US 2012/0198672 A1    Aug. 9, 2012

(30) Foreign Application Priority Data

Feb. 4, 2011  (JP) ................. 2011-023073

(51) Int. Cl.
*H03H 3/02* (2006.01)
*H03H 3/10* (2006.01)
*H03H 9/02* (2006.01)
*H01L 41/312* (2013.01)
*H01L 41/337* (2013.01)
*H03H 9/05* (2006.01)

(52) U.S. Cl.
CPC . *H03H 3/02* (2013.01); *H03H 3/10* (2013.01); *H03H 9/02574* (2013.01); *H01L 41/312* (2013.01); *H01L 41/337* (2013.01); *H03H 9/0504* (2013.01); *Y10T 29/42* (2013.01); *Y10T 29/49005* (2015.01); *Y10T 29/49153* (2015.01)

(58) Field of Classification Search
CPC ....... H03H 3/02; H03H 3/10; H03H 9/02574; H03H 9/0504; Y10T 29/42; Y10T 29/49005; Y10T 29/49155; H01L 41/312; H01L 41/337
See application file for complete search history.

(56) References Cited

U.S. PATENT DOCUMENTS

| 5,521,454 | A  | * | 5/1996 | Hattori et al. |
| 5,771,555 | A  |   | 6/1998 | Eda et al. |
| 5,925,973 | A  |   | 7/1999 | Eda et al. |
| 2007/0188047 | A1 |   | 8/2007 | Tanaka |
| 2009/0127978 | A1 | * | 5/2009 | Asai et al. |
| 2010/0123367 | A1 |   | 5/2010 | Tai et al. |
| 2010/0182101 | A1 |   | 7/2010 | Suzuki |
| 2010/0244631 | A1 |   | 9/2010 | Kobayashi et al. |
| 2011/0006860 | A1 | * | 1/2011 | Hara et al. |

FOREIGN PATENT DOCUMENTS

| JP | 07-193294 A | 7/1995 |
| JP | 09-130197 A | 5/1997 |
| JP | 3068140 B2  | 5/2000 |

(Continued)

OTHER PUBLICATIONS

Japanese Office Action dated Sep. 2, 2014, in a counterpart Japanese patent application No. 2011-023073.

*Primary Examiner* — A. Dexter Tugbang
(74) *Attorney, Agent, or Firm* — Chen Yoshimura LLP

(57) ABSTRACT

A method for manufacturing an acoustic wave device includes: bonding a piezoelectric substrate to a first surface of a first support substrate; thinning the piezoelectric substrate after the bonding to thus form a piezoelectric layer; forming a first electrode on a first surface of the piezoelectric layer; forming holes in the first support substrate located below the first electrode; and bonding a second support substrate to a second surface of the first support substrate opposite to the first surface after the forming of holes.

12 Claims, 17 Drawing Sheets

(56) References Cited

FOREIGN PATENT DOCUMENTS

| JP | 2000-312129 A |   | 11/2000 |
| JP | 2002-016473 A |   | 1/2002 |
| JP | 2004-221550 A |   | 8/2004 |
| JP | 2005-295250 A |   | 10/2005 |
| JP | 2006186412 A | * | 7/2006 |
| JP | 4315174 B2 |   | 5/2009 |
| JP | 2010-136317 A |   | 6/2010 |
| JP | 2010-147869 A |   | 7/2010 |
| JP | 2010-154315 A |   | 7/2010 |
| JP | 2010-154505 A |   | 7/2010 |
| JP | 2010-187373 A |   | 8/2010 |
| JP | 2010-220204 A |   | 9/2010 |
| JP | 2010-232725 A |   | 10/2010 |

* cited by examiner

US 9,148,107 B2

METHOD FOR MANUFACTURING ACOUSTIC WAVE DEVICE

CROSS-REFERENCE TO RELATED APPLICATION

This application is based upon and claims the benefit of priority of the prior Japanese Patent Application No. 2011-023073, filed on Feb. 4, 2011, the entire contents of which are incorporated herein by reference.

FIELD

A certain aspect of the present invention relates to a method for manufacturing an acoustic wave device. Another aspect of the present invention relates to a method for manufacturing an acoustic wave device utilizing a thin piezoelectric layer.

BACKGROUND

There is known a surface acoustic wave (SAW) device as an acoustic wave device using an acoustic wave. The SAW device is compact and light and is capable of attenuating signals greatly. Therefore, the SAW device is used as a filter for mobile communications such as portable phones.

Recently, a Lamb wave device and a film bulk acoustic resonator (FBAR) that use a thin piezoelectric layer have been proposed as devices obtained by developing the SAW device (see Japanese Patent Application Publication No. 2010-136317: Document 1). An acoustic wave device using a thin piezoelectric layer may have a structure in which a support substrate having a recess portion is bonded to a piezoelectric layer, and an electrode is provided to an upper surface of the piezoelectric layer or both the upper and lower surfaces thereof above a hollow portion defined by the recess portion.

There are various proposed methods for manufacturing the acoustic wave device utilizing the thin piezoelectric layer. For example, Document 1 discloses that the recess portion is formed in an area of the support substrate that is to be formed into the hollow portion, and is filled with a sacrificing layer beforehand. A piezoelectric substrate is bonded to the support substrate, and is then thinned to form the piezoelectric layer. Then, the electrode is formed on the upper surface of the piezoelectric layer. Finally, the sacrificing layer is removed through a via hole that is formed beforehand, whereby the hollow portion can be defined.

The method proposed in Document 1 is capable of preventing an unevenness of the thickness of the piezoelectric layer, as compared with a comparative case where the piezoelectric substrate is bonded to the support substrate having the recess portion that is not filled with the sacrificing layer (see paragraph 0142 and FIG. 36 of Document 1). However, there is a room left for improvement in the manufacturing method when aspects of productivity and easy manufacturability are taken into consideration.

SUMMARY OF THE INVENTION

According to an aspect of the present invention, there is provided a method for easily manufacturing an acoustic wave device with an improved productivity.

According to another aspect of the present invention, there is provided a method for manufacturing an acoustic wave device including: bonding a piezoelectric substrate to a first surface of a first support substrate; thinning the piezoelectric substrate after the bonding to thus form a piezoelectric layer; forming a first electrode on a first surface of the piezoelectric layer; forming holes in the first support substrate located below the first electrode; and bonding a second support substrate to a second surface of the first support substrate opposite to the first surface after the forming of holes.

DETAILED DESCRIPTION

Exemplary embodiments of the invention are described with reference to the accompanying drawings.

First Embodiment

Figure 1A:
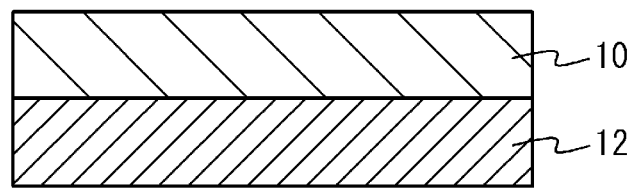
FIGS. 1A through 1F are cross-sectional views that illustrate a series of steps of a first method for manufacturing an acoustic wave device in accordance with a first embodiment.

An acoustic wave device in accordance with a first embodiment is a SAW device. A description is now given of a first method for manufacturing an acoustic wave device in accordance with the first embodiment with reference to FIGS. 1A through 1F. Referring to FIG. 1A, a lower surface of a piezoelectric substrate 10 is bonded to an upper surface of a first support substrate 12. The piezoelectric substrate 10 may be a lithium tantalate (LiTaO$_3$) substrate or a lithium niobate (LiNbO$_3$) substrate, which are respectively referred to as LT substrate and LN substrate in the following description. The first support substrate 12 may be a silicon (Si) substrate, for example. The method of bonding the piezoelectric substrate 10 and the first support substrate 12 may be a surface activation bonding method or a resin bonding method.

Figure 1B:
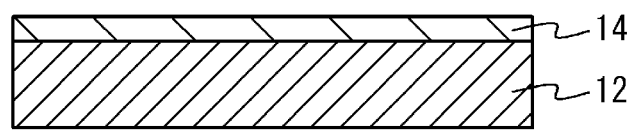

Referring to FIG. 1B, the piezoelectric substrate 10 is thinned under the condition that the piezoelectric substrate 10 has been bonded to the first support substrate 12. The piezoelectric substrate 10 is thinned to define a piezoelectric layer 14 having a thickness of, for example, 5 μm. The thinning method may be mechanical processing such as grinding or polishing.

Figure 1C:
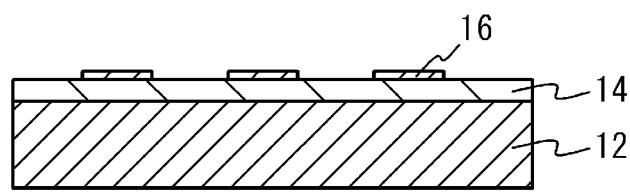
Figure 2A:
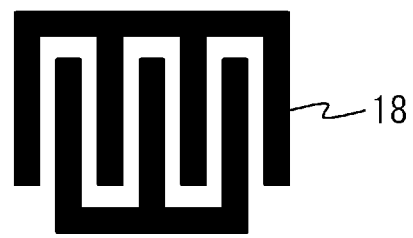
FIGS. 2A and 2B are schematic views of a first electrode.
Figure 2B:
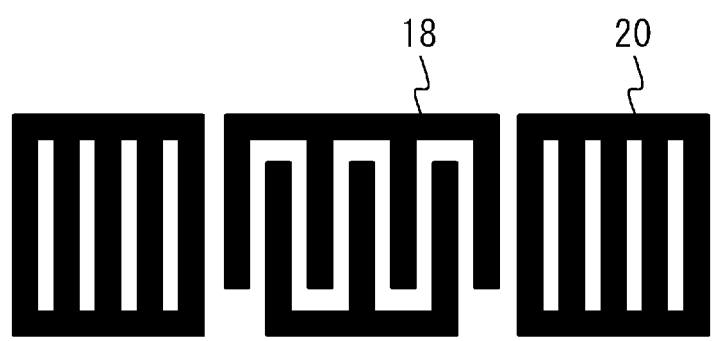

Referring to FIG. 1C, a first electrode 16 is formed on the upper surface of the piezoelectric layer 14. The first electrode 16 may be formed as follows. A metal film made of aluminum (Al) or copper (Cu) is formed on the whole upper surface of the piezoelectric layer 14 by a sputtering or evaporation technique so as to have a thickness of, for example, 0.1 μm~0.5 μm. Then, unnecessary portions of the metal film are removed by etching. FIGS. 2A and 2B illustrate examples of the first electrode 16. The first electrode 16 illustrated in FIG. 2A is a pair 18 of comb-tooth electrodes (interdigital electrode). The first electrode 16 illustrated in FIG. 2B includes reflection electrodes 20 arranged at both sides of the pair 18 of comb-tooth electrodes in the acoustic wave propagation direction.

Figure 1D:
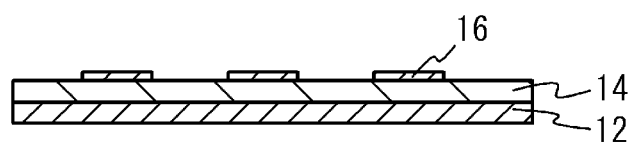

Referring to FIG. 1D, the first support substrate 12 is thinned so as to have a thickness of 50 μm, for example. The method for thinning the first support substrate 12 may be mechanical processing such as grinding or polishing as in the case of thinning the piezoelectric substrate 10 in FIG. 1B.

Figure 1E:
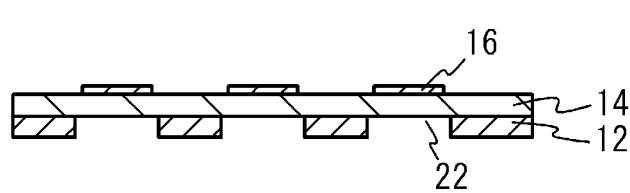

As illustrated in FIG. 1E, portions of the first support substrate 12 that are located in areas below the first electrode 16 are removed so as to form holes 22. The area in which the holes 22 are formed is designed to be larger than that in which the first electrode 16 is formed. That is, in the area in which the first electrode 16 is formed, the holes 22 are formed below the piezoelectric layer 14. The holes 22 may be formed by dry etching or wet etching.

Figure 1F:
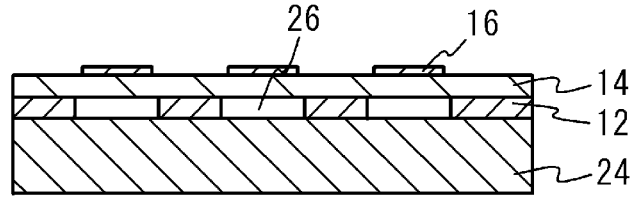

Referring to FIG. 1F, the second support substrate 24 is bonded to the lower surface of the first support substrate 12. By this bonding, the holes 22 are formed into the hollow portions 26, and the first electrode 16 is provided on the upper surface of the piezoelectric layer 14 above the hollow portions 26. The area of the piezoelectric layer 14 in which the first electrode 16 is provided is an exciting portion. The exciting portion of the piezoelectric layer 14 is separated from the first support substrate 12. The second support substrate 24 may be a silicon substrate, for example. The method for bonding the first support substrate 12 and the second support substrate 24 to each other may be a surface activation bonding method or a resin bonding method as in the case of bonding the piezoelectric substrate 10 and the first support substrate 12 to each other.

Figure 3A:
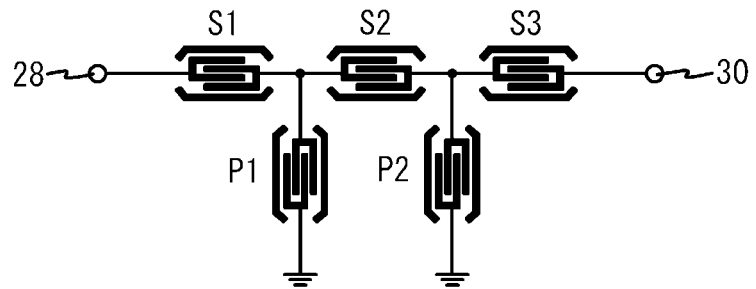
FIGS. 3A through 3D are schematic views of cases where an acoustic wave device of the first embodiment is used as a filter.
Figure 3B:
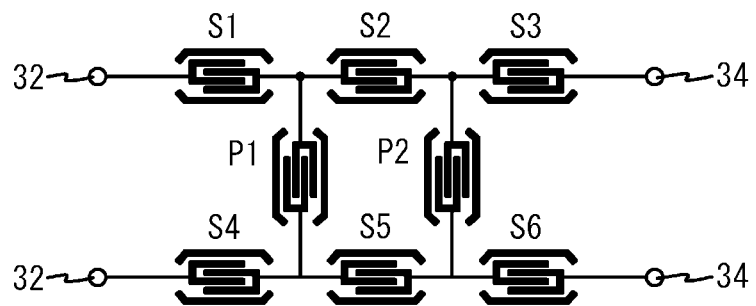
Figure 3C:
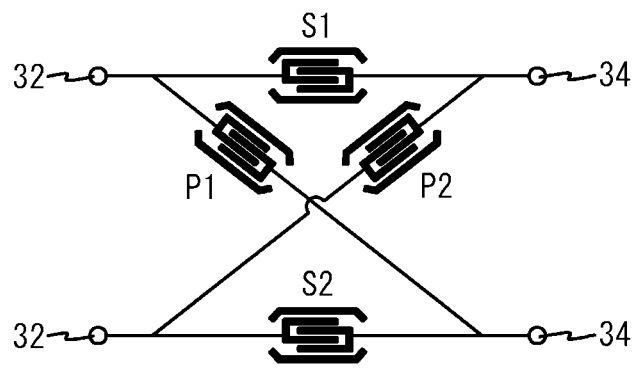
Figure 3D:
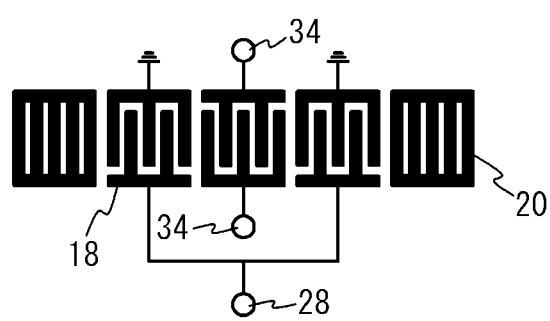

FIGS. 3A through 3D are schematic views of filters using the acoustic wave device of the first embodiment. A plurality of pairs 18 of comb-tooth electrodes each illustrated in FIGS. 2A and 2B function as resonators and may be combined so as to form a filter. FIGS. 3A and 3B illustrate ladder filters. More specifically, FIG. 3A illustrates a single-end type ladder filter, and FIG. 3B illustrates a balanced type ladder filter. FIG. 3C illustrates a balanced type lattice filter, and FIG. 3D illustrates a double-mode type SAW filter.

Referring to FIG. 3A, the single-end type ladder filter is composed of series resonators S1 through S3 connected in series with each other between a single unbalanced input terminal 28 and a single unbalanced output terminal 30, and parallel resonators P1 and P2 connected in parallel with the series resonators S1 through S3. Referring to FIG. 3B, the balanced type ladder filter is composed of series resonators S1 through S3 connected in series with one of the two balanced input terminals 32 and one of the two balanced output terminals 34, series resonators S4 through S6 connected in series with the other input terminal 32 and the other output terminal 34, and parallel resonators P1 and P2 connected in parallel with the series resonators S1 through S6.

Referring to FIG. 3C, the balanced type lattice filter includes two series resonators S1 and S2 that are connected in series with the two input terminals 32 and the two output terminals 34 as illustrated. The parallel resonator P1 is connected between the input terminal 32 connected to the series resonator S1 and the output terminal 34 connected to the series resonator S2. The parallel resonator P2 is connected between the input terminal 32 connected to the series resonator S2 and the output terminal 34 connected to the series resonator S1. As illustrated in FIG. 3D, the double-mode type SAW filter has three pairs 18 of comb-tooth electrodes arranged side by side in the SAW propagation direction, and two reflection electrodes 20 are provided further out than the arrangement of the three pairs 18. The unbalanced input terminal 28 is connected to one of the pair 18 of comb-tooth electrodes located on the left side of the arrangement and is connected to one of the pair 18 of comb-tooth electrodes located on the right side thereof. Two balanced output terminals 34 are connected to the pair 18 of comb-tooth electrodes located in the center of the arrangement.

Figure 4A:
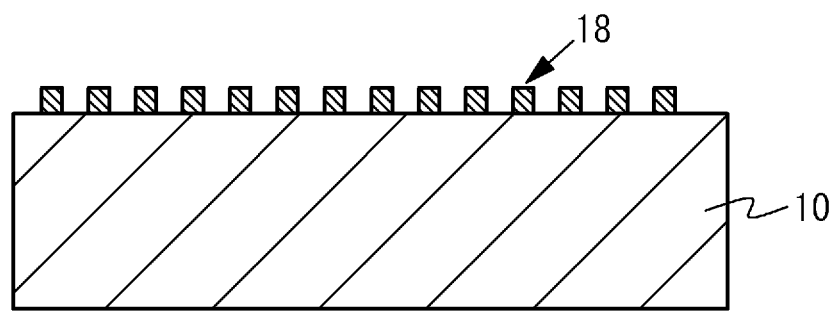
FIGS. 4A and 4B are cross-sectional views of a structure used in a simulation.
Figure 4B:
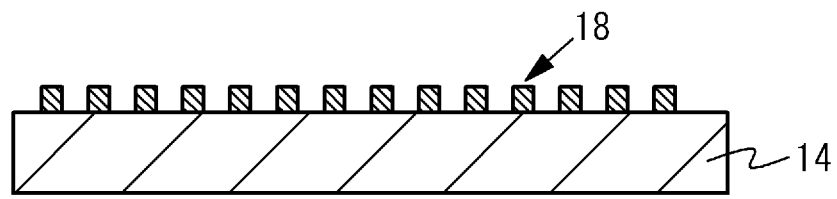

The inventors conducted a simulation in order to study that thinning of the piezoelectric substrate 10 to form the piezoelectric layer 14 brings about an improvement in the impedance characteristic. FIGS. 4A and 4B are schematic cross-sectional views of structures used in the simulation. FIG. 4A illustrates a simulation structure having the piezoelectric substrate 10 that is a general piezoelectric substrate and is relatively thick. FIG. 4B illustrates another simulation structure using the piezoelectric layer 14 formed by thinning the piezoelectric substrate 10. The structure illustrated in FIG. 4A is as follows. The piezoelectric substrate 10 is formed by 42°-rotated Y-cut LT, and has a thickness of 100λ where λ is the wavelength of the acoustic wave propagated on the piezoelectric substrate. One pair 18 of comb-tooth electrodes that is made of aluminum and has the infinite period is formed on the upper surface of the piezoelectric substrate 10. The structure illustrated in FIG. 4B is as follows. The piezoelectric layer 14 is formed by 42°-rotated Y-cut LT, and has a thickness of 0.2λ. One pair 18 of comb-tooth electrodes that is made of aluminum and has the infinite period is formed on the upper surface of the piezoelectric layer 14.

Figure 5:
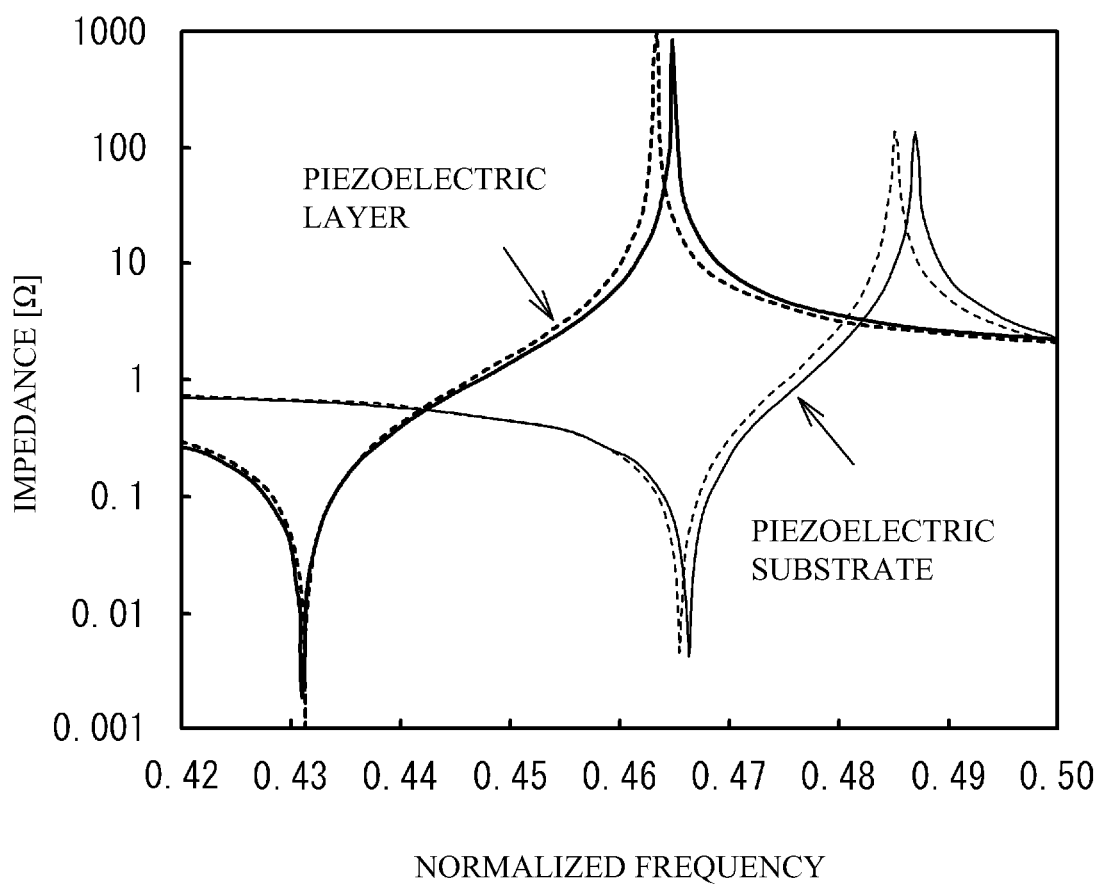
FIG. 5 illustrates results of the simulation.

FIG. 5 illustrates results of the simulation. The horizontal axis of FIG. 5 is the normalized frequency described as f(p/Vb) where f is the frequency, p is the electrode pitch, and Vb is the acoustic velocity of the bulk wave (for example, 42°-rotated Y-cut LT has an acoustic velocity of 4226 m/s). The vertical axis of FIG. 5 is the impedance (Ω). Solid lines in FIG. 5 are impedance characteristics obtained at room temperature (25° C.), and broken lines are impedance characteristics at a high temperature (125° C.). As illustrated in FIG. 5, the structure using the piezoelectric substrate 10 (thin lines in FIG. 5) has an electromechanical coupling coefficient K2 of 10%, a temperature coefficient of velocity (TCV) of −18.4 ppm/° C. at the resonance frequency, and a TCV of −29.6 ppm/° C. at the anti-resonance frequency. The structure using the piezoelectric substrate 14 (thick lines in FIG. 5) has an K2 of 16.6%, a TCV of +6.1 ppm/° C. at the resonance frequency, and a TCV of −14.5 ppm/° C. at the anti-resonance frequency.

As described above, the use of the piezoelectric layer 14 brings about an increased K2 and TCVs close to zero at the resonance and anti-resonance frequencies. That is, the use of the piezoelectric layer 14 improves K2 and TCV of the device characteristics.

As described above, according to the first method for manufacturing the acoustic wave device in accordance with the first embodiment, the piezoelectric substrate 10 is bonded to the upper surface of the first support substrate 12 in which the recess portions are not formed, and is then thinned to form the piezoelectric layer 14. That is, in the state in which the whole surface of the piezoelectric substrate 10 is bonded to the first support substrate 12, the piezoelectric substrate 10 is thinned to form the piezoelectric layer 14. It is thus possible to prevent the film thickness of the piezoelectric layer 14 from being made uneven.

As illustrated in FIGS. 1E and 1F, the holes 22 are formed by removing the portions of the first support substrate 12 located below the first electrode 16, and the second support substrate 24 is bonded to the lower surface of the first support substrate 12. The portion of the piezoelectric layer 14 on which the first electrode 16 is formed is the exciting portion, which is separated from the first support substrate 12, whereby the SAW device having an improved excitation efficiency is realized.

In the manufacturing method described in Document 1, the sacrificing layer is buried in the recess portion located in the area that is to be the hollow portion, and the via hole for removal of the sacrificing layer is formed in the piezoelectric substrate or the support substrate. In contrast, the first manufacturing method of the first embodiment does not use the sacrificing layer and does not need the via hole.

According to the first method for manufacturing the acoustic wave of the first embodiment, it is possible to easily manufacture the SAW device that has the piezoelectric layer 14 having uniform thickness and has the exciting portion of the piezoelectric layer 14 separated from the first support substrate 12. It is possible to easily manufacture the SAW device having excellent device characteristics such as K2 and TCV as illustrated in FIG. 5 with excellent productivity.

Further, as illustrated in FIGS. 1D and 1E, it is preferable that the first support substrate 12 is thinned, and the holes 22 are then formed by removing the portions of the first piezoelectric substrate 12 located below the first electrode 16. This sequence makes it possible to use a reduced amount of etching for forming the holes 22. Thus, the controllability of forming the holes 22 (that is, the hollow portions 26) can be improved and the hollow portions 26 can be formed easily.

The structure used in the simulation illustrated in FIG. 4B employs 42°-rotated Y-cut LT for the piezoelectric layer 14 and an ability of efficiently exciting a shear horizontal (SH) wave, whereby excellent device characteristics are obtained. Similar excellent device characteristics may be obtained when 64°-rotated Y-cut LN is used. Thinning of LT or LN makes it possible to confine the acoustic wave within the piezoelectric substrate and to prevent the occurrence of bulk wave emission loss inherent in the leakage acoustic wave. The acoustic wave device thus manufactured has low loss and a high Q value. From the above viewpoints, the piezoelectric layer 14 is preferably made of LT or LN.

The first support substrate 12 and the second support substrate 24 are not limited to the silicon substrates but may be made of another substance. Preferably, a substance has a property of making it possible to easily form the holes 22 and perform bonding to the piezoelectric substrate 10. For example, a substrate having a main component of Si such as a $SiO_2$ substrate may be used.

Figure 6A:
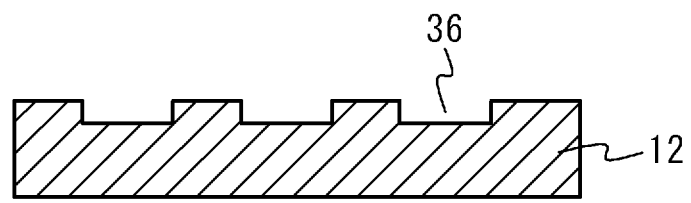
FIGS. 6A through 6D are cross-sectional views of a series of steps of a second method for manufacturing an acoustic wave device in accordance with the first embodiment.

A description is now given of a second method for manufacturing an acoustic wave device in accordance with the second embodiment with reference to FIGS. 6A through 7D. Referring to FIG. 6A, recess portions 36 that have a depth of 10 μm, for example, are formed in the upper surface of the first support substrate 12 by etching. This etching may be dry etching or wet etching.

Figure 6B:
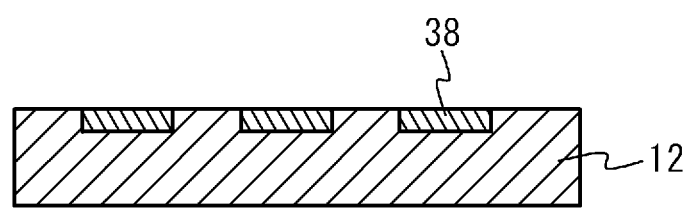

Referring to FIG. 6B, a sacrificing layer 38, which may be an oxide film such as a silicon oxide film, is deposited to the whole upper surface of the first support substrate 12 so as to be buried in the recess portions 36. Thereafter, the sacrificing layer 38 is grinded until the upper surface of the first support substrate 12 is exposed. Thus, the first support substrate 12 in which only the recess portions 36 are full of the sacrificing layer 38 is obtained. The sacrificing layer 38 is not limited to the silicon oxide film but may be made of a material that does not remove or damage the first support substrate 12, the piezoelectric layer 14 and the first electrode 16 at the time of removing the sacrificing layer 38.

Figure 6C:
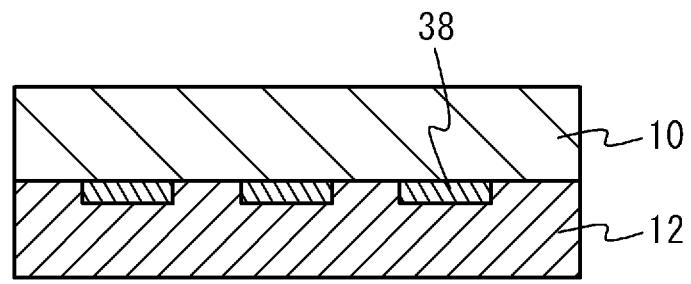
Figure 6D:
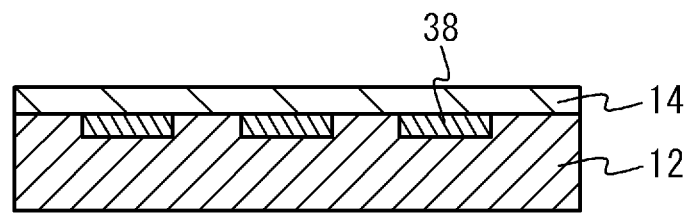

Referring to FIG. 6C, the piezoelectric substrate 10 is bonded to the upper surface of the first support substrate 12 on which the sacrificing layer 38 is formed. Referring to FIG. 6D, the piezoelectric substrate 10 is thinned to thus form the piezoelectric layer 14 in the state in which the piezoelectric substrate 10 has been bonded to the first support substrate 12.

Figure 7A:
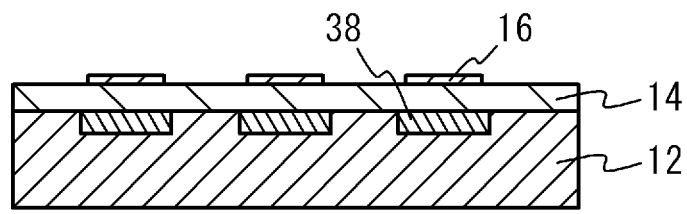
FIGS. 7A through 7D are cross-sectional views of a series of steps of the second method that follows the series of steps in FIGS. 6A through 6D.

Referring to FIG. 7A, the first electrode 16 is formed on the piezoelectric substrate 14 above the area in which the sacrificing layer 38 is formed. The first electrode 16 and the sacrificing layer 38 face each other through the piezoelectric layer 14. The recess portions 36 are formed so that the area in which the sacrificing layer 38 is provided is larger than the area in which the first electrode 16 is formed.

Figure 7B:
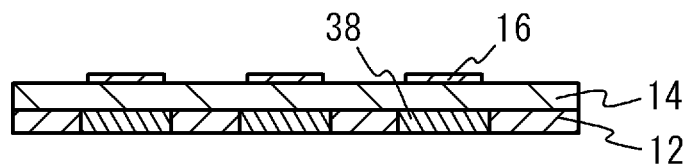
Figure 7C:
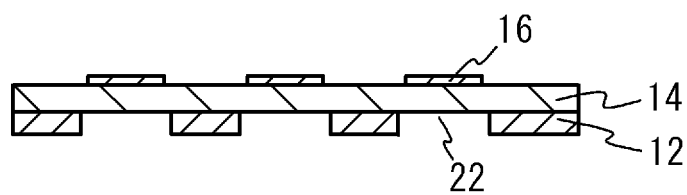

Referring to FIG. 7B, the first support substrate 12 is thinned until the sacrificing layer 38 is exposed. Referring to FIG. 7C, the exposed sacrificing layer 38 is removed by etching, whereby the holes 22 are formed in the area of the first support substrate 12 located below the first electrode 16, the above area being larger than the area in which the first electrode 16 is formed. The above etching may be dry etching or wet etching.

Figure 7D:
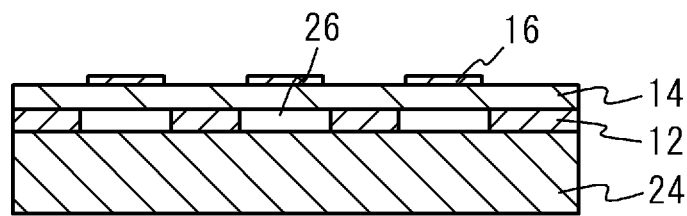

Referring to FIG. 7D, the second support substrate 24 is bonded to the lower surface of the first support substrate 12. Thus, the holes 22 are formed into the hollow portions 26, and the first electrode 16 is provided on the upper surface of the piezoelectric layer 14 located above the hollow portions 26.

As described above, according to the second method for manufacturing the acoustic wave device in accordance with the first embodiment, as illustrated in FIGS. 6A and 6B, the recess portions 36 are formed in the upper surface of the first support substrate 12, and are filled with the sacrificing layer 38. Next, as illustrated in FIG. 6C, the piezoelectric substrate 10 is bonded to the upper surface of the first support substrate 12 on which the sacrificing layer 38 is formed. Then, as illustrated in FIG. 6D, the piezoelectric substrate 10 is thinned to form the piezoelectric layer 14. That is, the piezoelectric substrate 10 is thinned to form the piezoelectric layer 14 in the state in which the whole surface of the piezoelectric substrate 10 is bonded to the first support substrate 12 and the sacrificing layer 38. It is thus possible to prevent the film thickness of the piezoelectric layer 14 from being made uneven.

As illustrated in FIG. 7B, the first support substrate 12 is thinned until the sacrificing layer 38 is exposed. As illustrated in FIG. 7C, the exposed sacrificing layer 38 is removed to form the holes 22 below the first electrode 16 by removing the exposed sacrificing layer 38. Thereafter, as illustrated in FIG. 7D, the second support substrate 24 is bonded to the lower surface of the first support substrate 12. It is thus possible to remove the sacrificing layer 38 without the via hole for removal of the sacrificing layer 38 that is employed in the manufacturing method described in Document 1. The exciting portion of the piezoelectric layer 14 is separated from the first support substrate 12, so that the SAW device having an improved excitation efficiency can be obtained.

According to the second method for manufacturing the acoustic wave device of the first embodiment, it is possible to easily manufacture the SAW device that has the piezoelectric layer 14 having uniform thickness and has the exciting portion of the piezoelectric layer 14 separated from the first support substrate 12. It is possible to easily manufacture the SAW device having excellent device characteristics such as K2 and TCV as illustrated in FIG. 5 with excellent productivity.

Second Embodiment

Figure 8A:
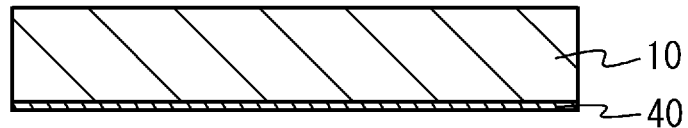
FIGS. 8A through 8D are cross-sectional views of a series of steps of a first method for manufacturing an acoustic wave device in accordance with a second embodiment.
Figure 8B:
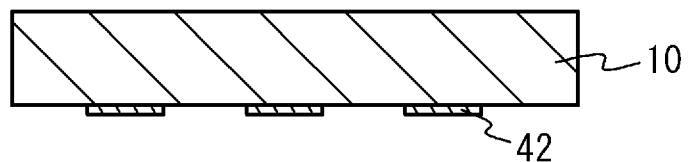

An acoustic wave device manufactured by a second embodiment is an exemplary FBAR. FIGS. 8A through 9D are cross-sectional views that illustrate a first method for manufacturing an acoustic wave device in accordance with the second embodiment. Referring to FIG. 8A, a metal film 40 is formed on the whole lower surface of the piezoelectric substrate 10 made of LT or LN by sputtering or evaporation technique. The metal film 40 may be made of Ru or Mo and may be 0.2 μm to 0.5 μm thick. Next, as illustrated in FIG. 8B, the unnecessary portions of the metal film 40 are removed by etching or the like, whereby second electrodes 42 are formed. The second electrode 42 is the lower electrode of the FBAR.

Figure 8C:
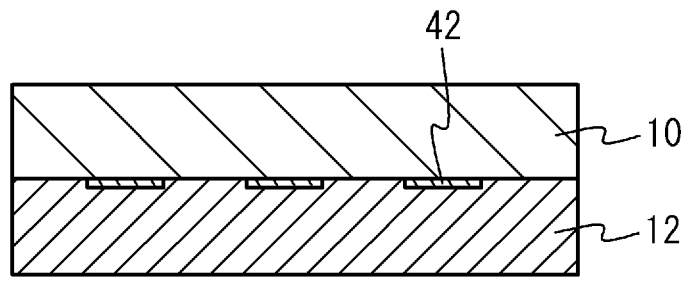
Figure 8D:
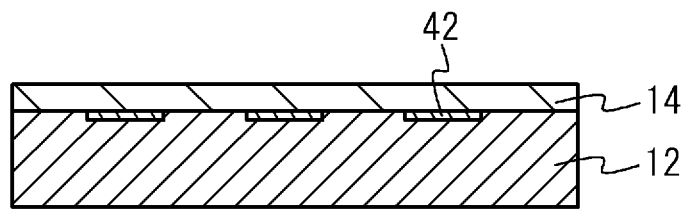

Referring to FIG. 8C, the lower surface of the piezoelectric substrate 10 on which the second electrodes 42 are formed is bonded to the upper surface of the first support substrate 12, which may be a silicon substrate. Referring to FIG. 8D, the piezoelectric substrate 10 is thinned to form the piezoelectric layer 14 in the state in which the piezoelectric substrate 10 has been bonded to the first support substrate 12.

Figure 9A:
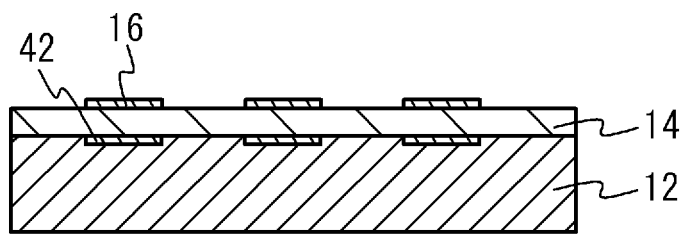
FIGS. 9A through 9D are cross-sectional views of a series of steps that follows the series of steps in FIGS. 8A through 8D.
Figure 9B:
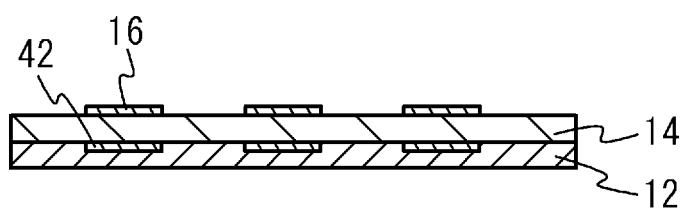

Referring to FIG. 9A, the first electrodes 16 are formed on the upper surface of the piezoelectric layer 14 and located above the second electrodes 42 so as to overlap the second electrodes 42. The first electrodes 16 are the upper electrodes of FBARs. Referring to FIG. 9B, the first support substrate 12 is thinned to an extent that the second electrodes 42 are not exposed.

Figure 9C:
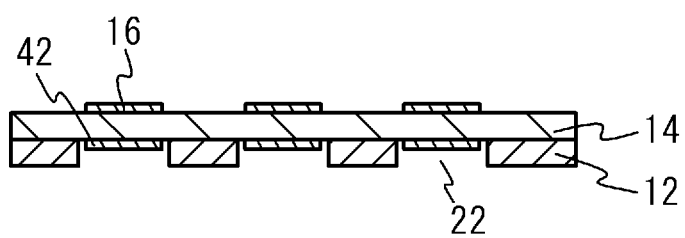

Referring to FIG. 9C, the holes 22 are formed by removing the portions of the first support substrate 12 located below the first electrodes 16 and the second electrodes 42. The areas in which the holes 22 are formed are larger than the areas in which the first electrodes 16 and the second electrodes 42 are formed. That is, the holes 22 are formed below the piezoelectric layer 14 in the areas in which the first electrodes 16 and the second electrodes 42 are formed.

Figure 9D:
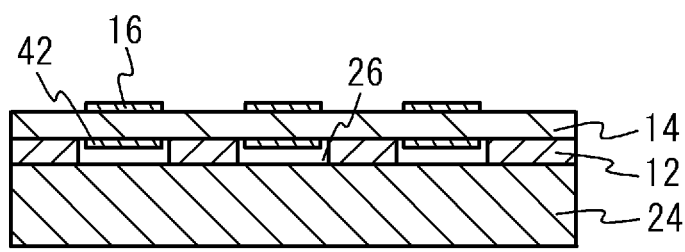

Referring to FIG. 9D, the second support substrate 24, which may be a silicon substrate, for example, is bonded to the lower surface of the first support substrate 12. Thus, the holes 22 are formed into the hollow portions 26. A resonator is located above each hollow portion 26 and is composed of the piezoelectric layer 14, the second electrode 42 serving as the lower electrode on the lower surface of the piezoelectric layer 14, and the first electrode 16 serving as the upper electrode on the upper surface thereof. The piezoelectric layer 14 sandwiched the second electrode 42 and the first electrode 16 is an exciting portion, which is separated from the first support substrate 12.

As described above, according to the first method for manufacturing the acoustic wave device of the second embodiment, as illustrated in FIGS. 8A and 8B, the second electrodes 42 are formed to the lower surface of the piezoelectric substrate 10. Next, as illustrated in FIG. 8C, the lower surface of the piezoelectric substrate 10 on which the second electrodes 42 are formed is bonded to the upper surface of the first support substrate 12. Then, as illustrated in FIG. 8D, the piezoelectric substrate 10 is thinned to form the piezoelectric layer 14. After that, as illustrated in FIG. 9A, the first electrodes 16 are formed on the upper surface of the piezoelectric layer 14 located above the second electrodes 42. The first support substrate 12 is thinned as illustrated in FIG. 9B, and the holes 22 are formed in the areas of the first support substrate 12 located below the first electrodes 16 and the second electrodes 42. Finally, as illustrated in FIG. 9D, the second support substrate 24 is bonded to the lower surface of the first support substrate 12.

According to the first method for manufacturing the acoustic wave device of the second embodiment, it is possible to easily manufacture the FBAR that has the piezoelectric layer 14 having uniform thickness and has the exciting portion of the piezoelectric substrate 14 separated from the first support substrate 12 with excellent productivity.

When the piezoelectric layer 14 is made of LT, the acoustic wave device of the second embodiment has a capability of efficiently exciting a thickness-shear (TS) wave, and has excellent device characteristics such as K2 and TCV.

Figure 10A:
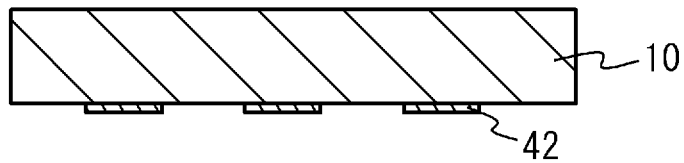
FIGS. 10A through 10D are cross-sectional views of a series of steps of a second method for manufacturing an acoustic wave device in accordance with the second embodiment.
Figure 10B:
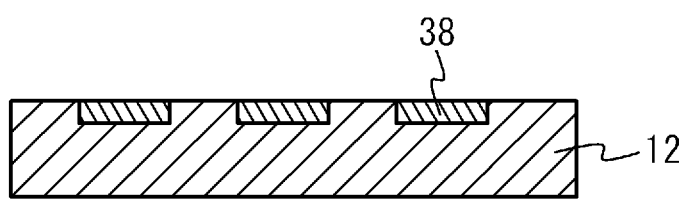
Figure 10C:
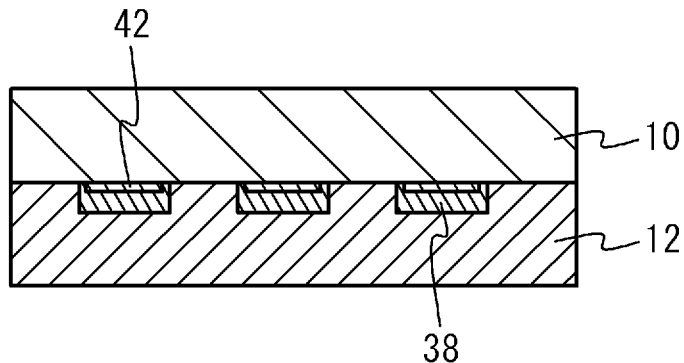
Figure 10D:
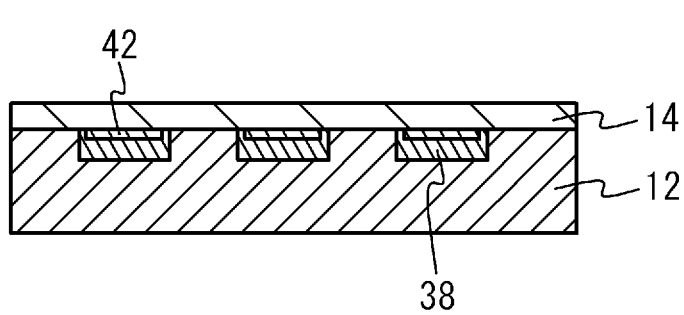

A description is now given, with reference to FIGS. 10A through 11D, of a second method for manufacturing an acoustic wave device in accordance with the second embodiment. Referring to FIG. 10A, the second electrodes 42, which are the lower electrodes of FBARs, are formed on the lower surface of the piezoelectric substrate 10. Referring to FIG. 10B, in parallel with the process of forming the second electrodes 42, the recess portions 36 are formed in the upper surface of the first support substrate 12 and are filled with the sacrificing layer 38. Referring to FIG. 10C, the upper surface of the first support substrate 12 in which the sacrificing layer 38 is formed and the lower surface of the piezoelectric substrate 10 on which the second electrodes 42 are formed are bonded together. This bonding is carried out so that the areas in which the sacrificing layer 38 is provided and the areas in which the second electrodes 42 are formed to overlap each other. Referring to FIG. 10D, the piezoelectric substrate 10 is thinned in the state in which the piezoelectric substrate 10 has been bonded to the first support substrate 12 to form the piezoelectric layer 14.

Figure 11A:
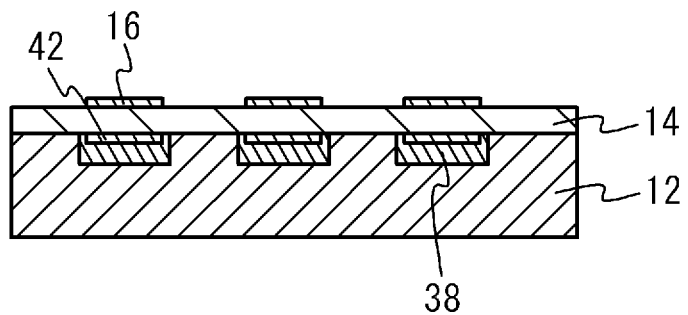
FIGS. 11A through 11D are cross-sectional views of a series of steps that follows the series of steps in FIGS. 10A through 10D.
Figure 11B:
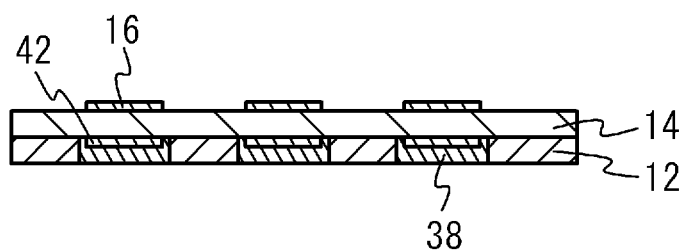
Figure 11C:
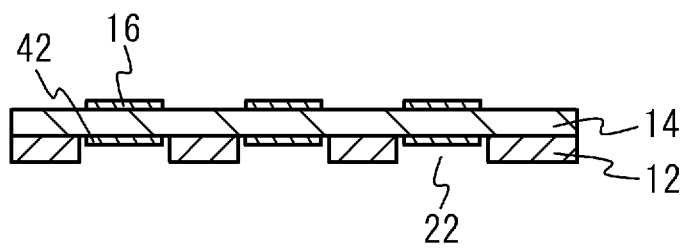
Figure 11D:
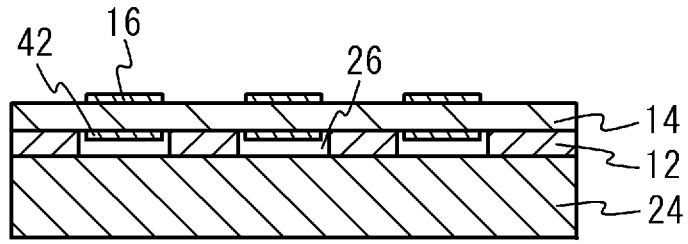

Referring to FIG. 11A, the first electrodes 16 are formed on the upper surface of the piezoelectric layer 14 in positions above the areas in which the sacrificing layer 38 is formed. That is, the first electrodes 16 and the second electrodes 42 are provided so as to overlap each other. Referring to FIG. 11B, the first support substrate 12 is thinned until the sacrificing layer 38 is exposed. Referring to FIG. 11C, the exposed sacrificing layer 38 is removed to form the holes 22 in the first support substrate 12 located below the first electrodes 16 and the second electrodes 42. Referring to FIG. 11D, the second support substrate 24 is bonded to the lower surface of the first support substrate 12.

The method for manufacturing the acoustic wave device in accordance with the second embodiment uses the sacrificing layer 38. However, as in the case of the second manufacturing method of the first embodiment, it is possible to easily manufacture the FBAR that has the piezoelectric layer 14 having uniform thickness and has the exciting portion of the piezoelectric substrate 14 separated from the first support substrate 12 with excellent productivity.

Third Embodiment

Figure 12A:
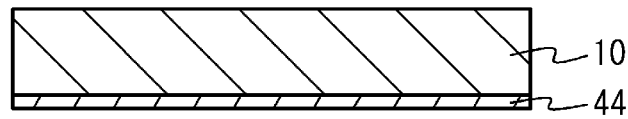
FIGS. 12A through 12E are cross-sectional views of a series of steps of a method for manufacturing an acoustic wave device in accordance with a third embodiment.
Figure 12B:
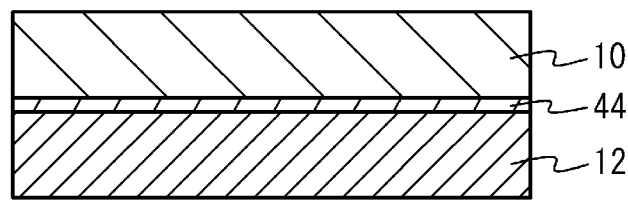

An acoustic wave device manufactured by a third embodiment is an SAW device in which a silicon oxide film is provided to the lower surface of the piezoelectric layer 14. FIGS. 12A through 12E are schematic cross-sectional views that illustrate a method for manufacturing the acoustic wave device in accordance with the third embodiment. Referring to FIG. 12A, a silicon oxide film 44 is deposited on the whole lower surface of the piezoelectric substrate 10 made of LT or LN. The thickness of the silicon oxide film 44 is 1 µm, for example. Referring to FIG. 12B, the lower surface of the piezoelectric substrate 10 on which the silicon oxide film 44 is formed is bonded to the upper surface of the first support substrate 12, which may be a silicon substrate, for example.

Figure 12C:
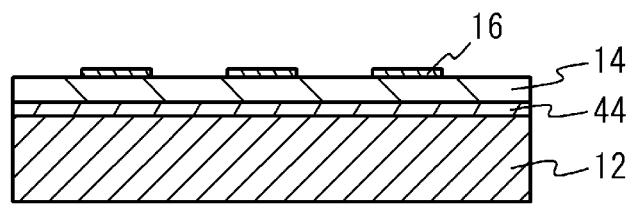
Figure 12D:
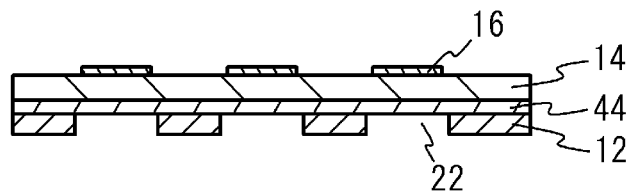
Figure 12E:
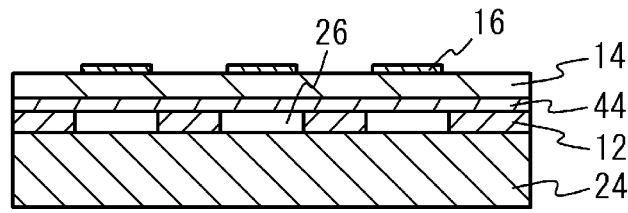

Referring to FIG. 12C, the piezoelectric substrate 10 is thinned to form the piezoelectric layer 14 in the state in which the piezoelectric substrate 10 has been bonded to the first support substrate 12. Then, the first electrodes 16 are formed on the upper surface of the piezoelectric layer 14. Referring to FIG. 12D, the first support substrate 12 is thinned, and the portions of the first support substrate 12 below the first electrodes 16 are removed to form the holes 22. Referring to FIG. 12E, the second support substrate 24, which may be a silicon substrate, for example, is boned to the lower surface of the first support substrate 12.

The acoustic wave device manufactured by the method in accordance with the third embodiment has the silicon oxide film 44 provided on the lower surface of the piezoelectric layer 14. In a case where the piezoelectric layer 14 is as thin as 1×, for example, the silicon oxide film 44 attached to the lower surface of the piezoelectric layer 14 results in a temperature compensation effect. That is, the silicon oxide film 44 functions as a temperature compensation film. Since the silicon oxide film 44 is not provided on the first electrodes 16 but is provided to the lower surface of the piezoelectric layer 14, the silicon oxide film 44 does not have any roughness and leads to excellent propagation characteristics.

As described above, according to the manufacturing method of the third embodiment, the silicon oxide film 44 is formed to the lower surface of the piezoelectric substrate 10 as illustrated in FIG. 12A, and the lower surface of the piezoelectric substrate 10 on which the silicon oxide film 44 is formed is bonded to the upper surface of the first support substrate 12 as illustrated in FIG. 12B. Then, as illustrated in FIG. 12C, the piezoelectric substrate 10 is thinned to form the piezoelectric layer 14, and the first electrodes 16 are formed on the upper surface of the piezoelectric layer 14. After that, as illustrated in FIG. 12D, the holes 22 are formed in the areas of the first support substrate 12 located below the first electrodes 16. As illustrated in FIG. 12E, the second support substrate 24 is bonded to the lower surface of the first support substrate 12. It is possible to easily manufacture the SAW device that has the piezoelectric layer 14 having uniform thickness, the exciting portion of the piezoelectric substrate 14 separated from the first support substrate 12, and the silicon oxide film 44 functioning as the temperature compensation layer with excellent productivity.

The insulative film provided on the lower surface of the piezoelectric layer 14 is not limited to the silicon oxide film 44 but may be another insulative film that functions as the temperature compensation layer.

The acoustic wave device of the third embodiment may be manufactured by a method using the sacrificing layer 38 like the second manufacturing method of the first embodiment described with reference to FIGS. 6A through 7D. In this case, the step of FIG. 12A is carried out to deposit the silicon oxide film 44 on the whole lower surface of the piezoelectric substrate 10. Then, the process described with reference to the FIGS. 6A through 7D is carried out.

Fourth Embodiment

Figure 13A:
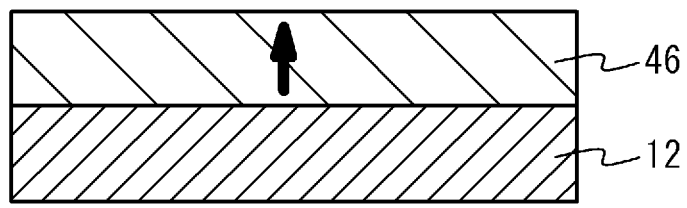
FIGS. 13A through 13D are cross-sectional views of a series of steps of a method for manufacturing an acoustic wave device in accordance with a fourth embodiment.
Figure 13B:
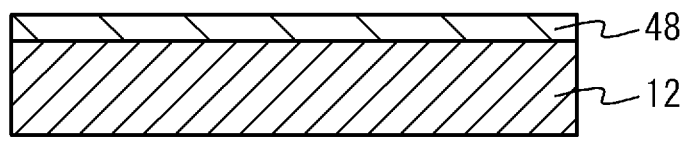

An acoustic wave device manufactured by a fourth embodiment is an exemplary SAW device using the piezoelectric layer 14 composed of two piezoelectric layers having mutually opposite directions of polarization. FIGS. 13A through 14D are schematic cross-sectional views that illustrate a method for manufacturing the acoustic wave device in accordance with the fourth embodiment. Referring to FIG. 13A, a lower surface of a first piezoelectric substrate 46 is bonded to the upper surface of the first support substrate 12, which may be a silicon substrate, for example. The first piezoelectric substrate 46 may be an LT substrate or an LN substrate having an upward direction of polarization is, as indicated by an arrow in FIG. 13A. Referring to FIG. 13B, the first piezoelectric substrate 46 is thinned to form a first piezoelectric layer 48 having a thickness of 10λ, for example.

Figure 13C:
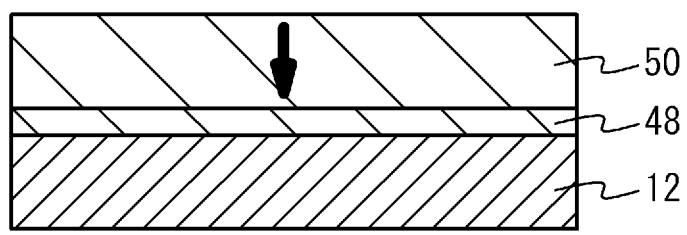
Figure 13D:
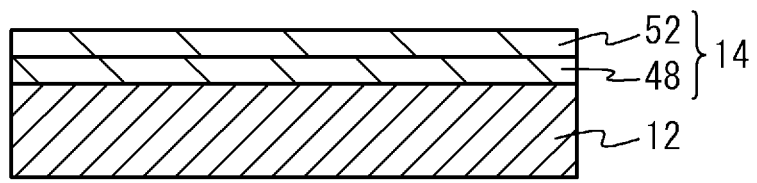

Referring to FIG. 13C, a lower surface of a second piezoelectric substrate 50 is bonded to an upper surface of the first piezoelectric layer 48. The second piezoelectric substrate 50 is made of the same material as the first piezoelectric substrate 46, and has a downward direction of polarization, as indicated by an arrow in FIG. 13C. Referring to FIG. 13D, the second piezoelectric substrate 50 is thinned to form a second piezoelectric layer 52 having a thickness of 0.2λ, for example.

Figure 14A:
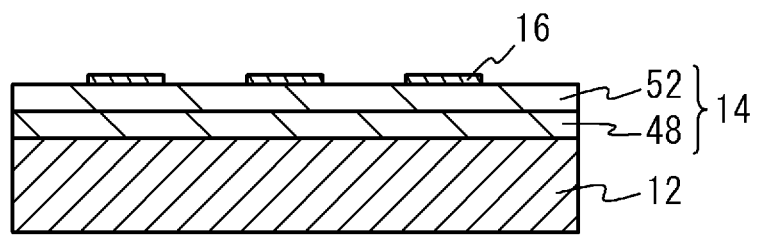
FIGS. 14A through 14D are cross-sectional views of a series of steps that follows the series of steps in FIGS. 13A through 13D.
Figure 14B:
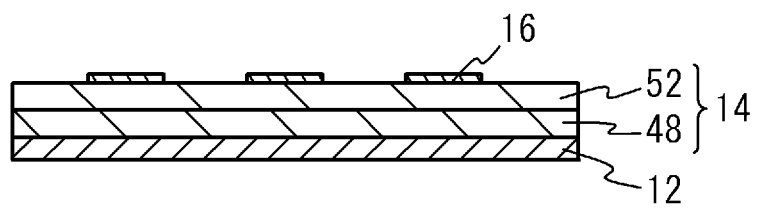
Figure 14C:
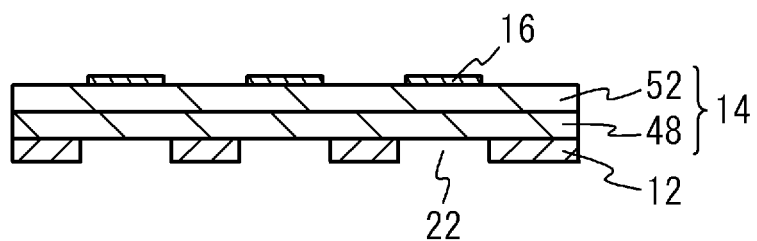
Figure 14D:
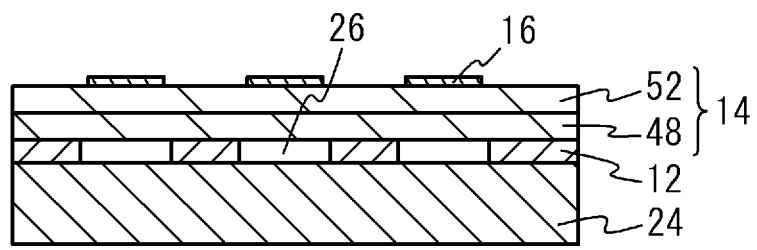

Referring to FIG. 14A, the first electrode 16 is formed on the upper surface of the piezoelectric layer 14. Referring to FIG. 14B, the first support substrate 12 is thinned. Then, the first support substrate 12 in the areas below the first electrode 16 are removed to form the holes 22, as illustrated in FIG. 14C. Referring to FIG. 14D, the second support substrate 24, which may be a silicon substrate, is bonded to the lower surface of the first support substrate 12.

Figure 15:
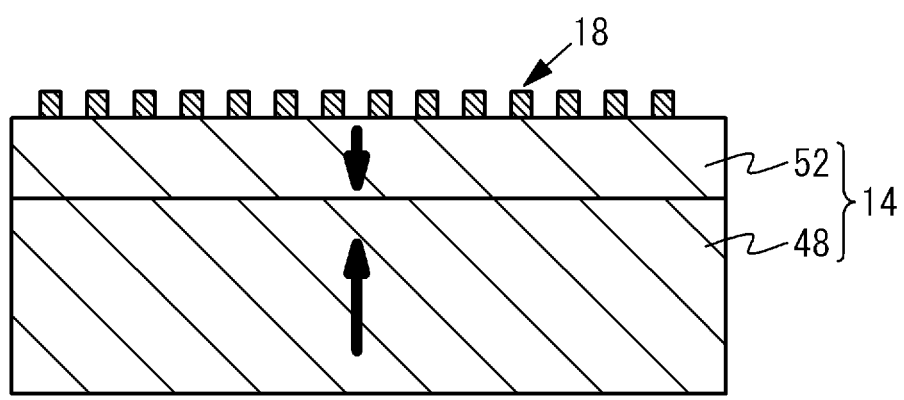
FIG. 15 is a cross-sectional view of a structure used in a simulation.

The inventors conducted a simulation in order to study that the use of the piezoelectric layer 14 composed of two piezoelectric layers having the mutually opposite directions of polarization brings about an improvement in the impedance characteristic. FIG. 15 is a schematic cross-sectional view of a structure used in the simulation in which the piezoelectric layer 14 is composed of the first piezoelectric layer 48 and the second piezoelectric layer 52 having the mutually opposite directions of polarization as indicated by arrows in FIG. 15. It is assumed that the first piezoelectric layer 48 is considerably thick with regard to the wavelength of the acoustic wave. The first piezoelectric layer 48 is formed by 222°-rotated Y-cut LT. The second piezoelectric layer 52 is formed by 42°-rotated Y-cut LT and is 0.2λ thick. One pair 18 of comb-tooth electrodes that is made of aluminum and has the infinite period is formed on the upper surface of the piezoelectric substrate 14. The first piezoelectric layer 48 has a thickness equal to or larger than 1λ.

Figure 16:
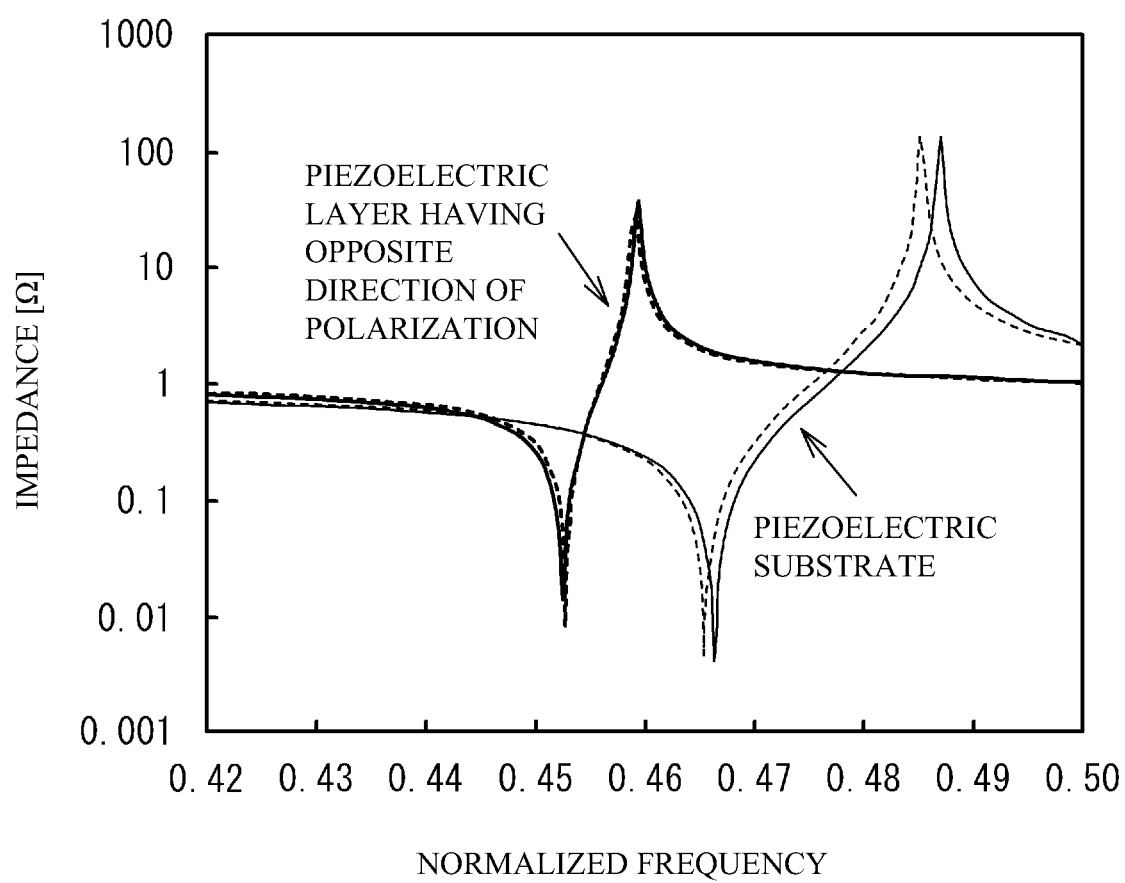
FIG. 16 illustrates results of the simulation.

FIG. 16 illustrates results of the simulation. The horizontal axis of FIG. 16 is the normalized frequency, and the vertical axis thereof is the impedance. Solid lines in FIG. 16 indicate impedance characteristics obtained at room temperature (25° C.), and broken lines are impedance characteristics at a high temperature (125° C.). For the purpose of comparison, FIG. 16 illustrates the simulation results obtained when the piezoelectric substrate 10 having the general thickness illustrated in FIG. 4A is used. As illustrated in FIG. 16, the structure using the piezoelectric substrate 10 (thin lines in FIG. 16) has K2 of 10%, a TCV of −18.4 ppm/° C. at the resonance frequency, and a TCV of −29.6 ppm/° C. at the anti-resonance frequency. The structure using the piezoelectric substrate 14 (thick lines in FIG. 16) has an K2 of 3.6%, a TCV of +4.1 ppm/° C. at the resonance frequency, and a TCV of −9.5 ppm/° C. at the anti-resonance frequency.

As described above, the use the piezoelectric substrate 14 composed of the first piezoelectric layer 48 and the second piezoelectric layer 52 having the mutually opposite directions of polarization improves the device characteristics, more especially, TCVs at the resonance and anti-resonance frequencies.

According to the first method for manufacturing the acoustic wave device of the fourth embodiment, after the first piezoelectric substrate 46 is bonded to the upper surface of the first support substrate 12 as illustrated in FIG. 13A, the first piezoelectric substrate 46 is thinned to form the first piezoelectric layer 48, as illustrated in FIG. 13B. Then, as illustrated in FIG. 13C, the second piezoelectric substrate 50 that is made of the same material as the first piezoelectric layer 48 and has the polarization direction opposite to that of the first piezoelectric substrate 46 is bonded to the upper surface of the first piezoelectric substrate 46. As illustrated in FIG. 13D, the second piezoelectric substrate 50 is thinned to form the second piezoelectric layer 52. Thus, the piezoelectric layer 14 composed of the first piezoelectric layer 48 and the second piezoelectric layer 52 is formed. Then, as illustrated in FIG. 14A, the first electrode 16 is formed on the upper surface of the piezoelectric layer 14. Thereafter, as illustrated in FIG. 14C, the holes 22 are formed in the areas of the first support substrate 12 located below the first electrode 16. Then, as illustrated in FIG. 14D, the second support substrate 24 is bonded to the lower surface of the first support substrate 12. It is possible to easily manufacture the SAW device that has the piezoelectric layer 14 configured to be composed of the first piezoelectric layer 48 and the second piezoelectric layer 52 and have uniform thickness and that has the exciting portion of the piezoelectric substrate 14 separated from the first support substrate 12 with excellent productivity. That is, as illustrated in FIG. 16, it is possible to easily manufacture the SAW device having excellent device characteristics such as TCV with excellent productivity.

Figure 17A:
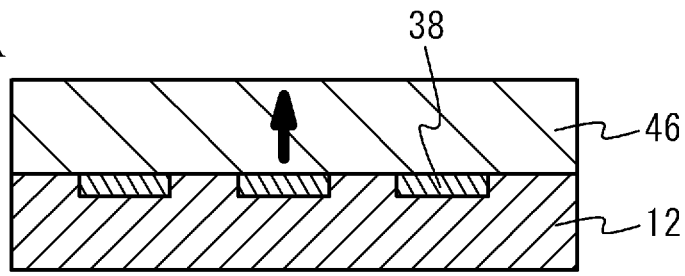
FIGS. 17A through 17D are cross-sectional views of a series of steps of a second method for manufacturing an acoustic wave device in accordance with the fourth embodiment.
Figure 17B:
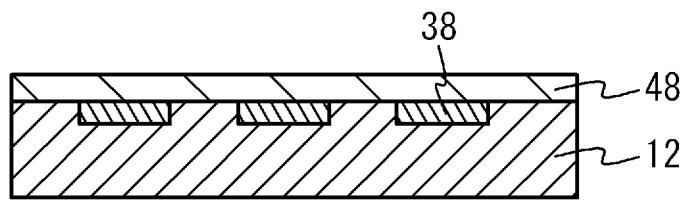

The acoustic wave device of the fourth embodiment may be manufactured by using the sacrificing layer 38 like the second manufacturing method of the first embodiment described with reference to FIGS. 6A through 7D. In this case, as illustrated in FIG. 17A, the first support substrate 12 having the recess portions 36 full of the sacrificing layer 38 is prepared, and the first piezoelectric substrate 46 is bonded to the upper surface of the first support substrate 12 in which the sacrificing layer 38 is formed. Then, as illustrated in FIG. 17B, the first piezoelectric substrate 46 is thinned to form the first piezoelectric layer 48.

Figure 17C:
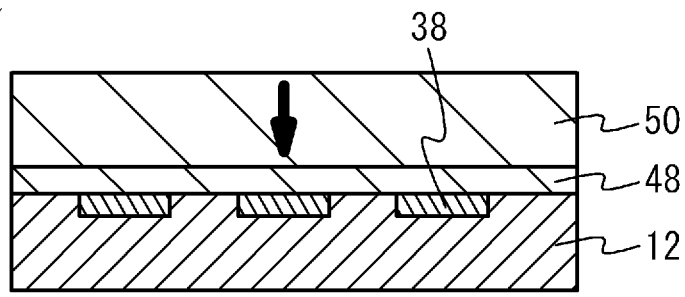
Figure 17D:
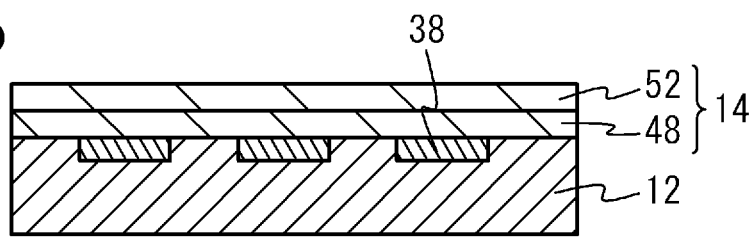

Referring to FIG. 17C, the second piezoelectric substrate 50 is bonded to the upper surface of the first piezoelectric layer 48. Then, as illustrated in FIG. 17D, the second piezoelectric substrate 50 is thinned to form the second piezoelectric layer 52, whereby the piezoelectric layer 14 composed of the first piezoelectric layer 48 and the second piezoelectric layer 52 is formed. The following steps are similar to those of the second manufacturing method of the first embodiment illustrated in FIGS. 7A through 7D, whereby the acoustic wave device of the fourth embodiment can be obtained.

The acoustic wave device manufactured by the fourth embodiment is not limited to the SAW device but may be a piezoelectric thin-film resonator. In this case, the second electrodes 42, which should be the lower electrodes of the resonators, are formed to the lower surface of the first piezoelectric substrate 46. The lower surface of the first piezoelectric substrate 46 on which the second electrodes 42 are formed is bonded to the upper surface of the first support substrate 12. Thereafter, steps similar to those illustrated in FIGS. 13A through 14D are carried out.

The first piezoelectric layer 48 and the second piezoelectric layer 52 may have different thicknesses. However, it is preferable that the first piezoelectric layer 48 and the second piezoelectric layer 52 have the same thickness as each other. This is because the same thickness excites the second harmonic, which is advantageous to manufacturing resonators operable at high frequencies.

The polarization directions of the first piezoelectric layer 48 and the second piezoelectric layer 52 are not limited to the aforementioned directions. The first piezoelectric layer 48 may have the downward direction of polarization, and the second piezoelectric layer 52 may have the upward direction of polarization.

Now, a second method for manufacturing an acoustic wave device in accordance with the fourth embodiment is described. First, like the first method described with FIGS. 13A and 13B, the first piezoelectric substrate 46 is bonded to the upper surface of the first support substrate 12, and is thinned to form the first piezoelectric layer 48. Next, the second piezoelectric layer 52 is formed on the upper surface of the first piezoelectric layer 48 by chemical vapor deposition (CVD), for example. The second piezoelectric layer 52 is made of the same material as the first piezoelectric layer 48 and has a polarization direction opposite to that of the first piezoelectric layer 48. Thus, the piezoelectric layer 14 composed of the first piezoelectric layer 48 and the second piezoelectric layer 52 is formed as illustrated in FIG. 13D. Then, steps similar to those of FIGS. 14A through 14D are carried out, whereby the acoustic wave device can be formed by the fourth embodiment.

According to the second method of the fourth embodiment, it is possible to easily manufacture the SAW device that has the piezoelectric layer 14 configured to be composed of the first piezoelectric layer 48 and the second piezoelectric layer 52 and have uniform thickness and that has the exciting portion of the piezoelectric substrate 14 separated from the first support substrate 12 with excellent productivity. That is, as illustrated in FIG. 16, it is possible to easily manufacture the SAW device having excellent device characteristics such as TCV with excellent productivity.

The present invention is not limited to the specifically described embodiments, but other embodiments and variations thereof may be made without departing from the scope of the claimed invention.

What is claimed is:

1. A method for manufacturing an acoustic wave device comprising:
  bonding a piezoelectric substrate to a first surface of a first support substrate;
  thinning a whole of the piezoelectric substrate in a thickness direction of the piezoelectric substrate after the bonding to thus form a piezoelectric layer;
  forming a first electrode on a first surface of the piezoelectric layer after the thinning of the piezoelectric substrate, the first surface of the piezoelectric layer being an opposite surface to a second surface of the piezoelectric layer located at a side of the first support substrate;

forming holes in the first support substrate located below the first electrode; and bonding a second support substrate to a second surface of the first support substrate opposite to the first surface of the first support substrate after the forming of holes.

2. The method according to claim 1, further comprising thinning the first support substrate after the forming of the first electrode, wherein the forming of holes includes removing portions of the first support substrate that has been thinned from the second surface of the piezoelectric substrate opposite to the first surface of the piezoelectric substrate.

3. The method according to claim 1, further comprising forming recess portions in the first surface of the first support substrate before the bonding of the piezoelectric substrate, and burying a sacrificing layer in the recess portions, wherein:
the bonding of the piezoelectric substrate includes bonding the piezoelectric substrate to the first surface of the first support substrate in which the sacrificing layer is formed;
the forming of the first electrode includes forming the first electrode above the sacrificing layer;
the method includes thinning the first support substrate from the second surface of the first support substrate after the forming of the first electrode until the sacrificing layer is exposed; and
the forming of holes includes removing the sacrificing layer that has been exposed from the second surface side of the first support substrate.

4. The method according to claim 1, further comprising forming an insulative film on a surface of the piezoelectric substrate that is to be bonded to the first surface of the first support substrate, wherein the bonding of the piezoelectric substrate includes bonding the surface of the piezoelectric substrate on which the insulative film is formed to the first surface of the first support substrate.

5. The method according to claim 1, further comprising forming a second electrode on a surface of the piezoelectric substrate before the bonding of the piezoelectric substrate, wherein:
the bonding of the piezoelectric substrate includes bonding the surface of the piezoelectric substrate on which the second electrode is formed to the first surface of the first support substrate; and
the forming of the first electrode includes forming the first electrode so as to be located above the second electrode.

6. The method according to claim 5, wherein the acoustic wave device has the piezoelectric layer sandwiched between the first electrode and the second electrode.

7. The method according to claim 1, wherein the bonding of the piezoelectric substrate includes bonding a first piezoelectric substrate on the first surface of the first support substrate, and bonding a second piezoelectric substrate on a surface of a first piezoelectric layer obtained by thinning the first piezoelectric substrate after the bonding of the first piezoelectric substrate, the second piezoelectric substrate being made of a material identical to that of the first piezoelectric substrate and has a direction of polarization opposite to that of the first piezoelectric substrate,
wherein the forming of the piezoelectric layer includes thinning the second piezoelectric substrate to thus form a second piezoelectric layer, the piezoelectric layer being thus composed of the first piezoelectric layer and the second piezoelectric layer.

8. The method according to claim 1, wherein:
the bonding of the piezoelectric substrate includes bonding a first piezoelectric substrate to the first surface of the first support substrate;
the forming of the piezoelectric layer includes thinning the first piezoelectric substrate to form a first piezoelectric layer after the first piezoelectric substrate is bonded, and forming a second piezoelectric layer on the first piezoelectric layer;
the second piezoelectric layer is made of a material identical to that of the first piezoelectric layer and has a direction of polarization opposite to that of the first piezoelectric layer; and
the piezoelectric layer is composed of the first piezoelectric layer and the second piezoelectric layer.

9. The method according to claim 1, wherein the first electrode includes comb-tooth electrodes.

10. The method according to claim 1, wherein the piezoelectric layer is made of one of $LiTaO_3$ and $LiNbO_3$.

11. The method according to claim 1, wherein the first and second support substrates are silicon substrates or substrates including silicon as a main component.

12. The method according to claim 1, wherein the thinning of the piezoelectric substrate includes thinning the piezoelectric substrate by grinding or polishing.

* * * * *